United States Patent [19]

Shinneman et al.

[11] Patent Number: 5,449,445
[45] Date of Patent: * Sep. 12, 1995

[54] SPUTTERING TARGET WITH MACHINE READABLE INDICIA

[75] Inventors: Frank M. Shinneman, Ridgewood; Steven Hurwitt, Park Ridge, both of N.J.

[73] Assignee: Materials Research Corporation, Orangeburg, N.Y.

[*] Notice: The portion of the term of this patent subsequent to Feb. 8, 2011 has been disclaimed.

[21] Appl. No.: 164,759

[22] Filed: Dec. 10, 1993

Related U.S. Application Data

[63] Continuation-in-part of Ser. No. 791,415, Nov. 13, 1991, Pat. No. 5,284,561.

[51] Int. Cl.$^6$ ............................................. C23C 14/34
[52] U.S. Cl. ........................ 204/298.12; 204/298.13; 204/298.09
[58] Field of Search ............... 204/192.12, 298.02, 204/298.03, 192.13, 192.33, 298.09, 298.08, 298.12, 298.13

[56] References Cited

U.S. PATENT DOCUMENTS

| | | | |
|---|---|---|---|
| 4,166,783 | 9/1979 | Turner | 204/192 R |
| 4,508,612 | 4/1985 | Blackwell et al. | 204/298.19 X |
| 4,756,814 | 7/1988 | van Voren et al. | 204/294 |
| 4,902,398 | 2/1990 | Homstad | 204/298 |
| 4,957,605 | 9/1990 | Hurwitt et al. | 204/192.12 |
| 5,009,765 | 4/1991 | Qamar et al. | 204/298.12 |
| 5,126,028 | 6/1992 | Hurwitt et al. | 204/192.13 |
| 5,130,005 | 7/1992 | Hurwitt et al. | 204/192.12 |
| 5,284,561 | 2/1994 | Shinneman | 204/192.13 |

*Primary Examiner*—Nam Nguyen
*Attorney, Agent, or Firm*—Wood, Herron & Evans

[57] ABSTRACT

An expendable target of sputter coating material is provided having secured thereto a storage medium having recorded thereon, in machine readable indicia, information relating to a characteristic of the target. The information preferably includes target identifying information and may also include information relating to the target composition, the history of the use of the target, and other information usable by the apparatus to automatically set machine parameters or to record process information. Information, particularly of the use of the target, may be updated and written to a medium on the target or target assembly, or to a machine readable medium which may be affixed to the target assembly when the target is removed. The target is preferably one piece with a cooling surface opposite its sputtering surface, and having the indicia fixed to the sputtering material at the periphery or rim of the target.

12 Claims, 3 Drawing Sheets

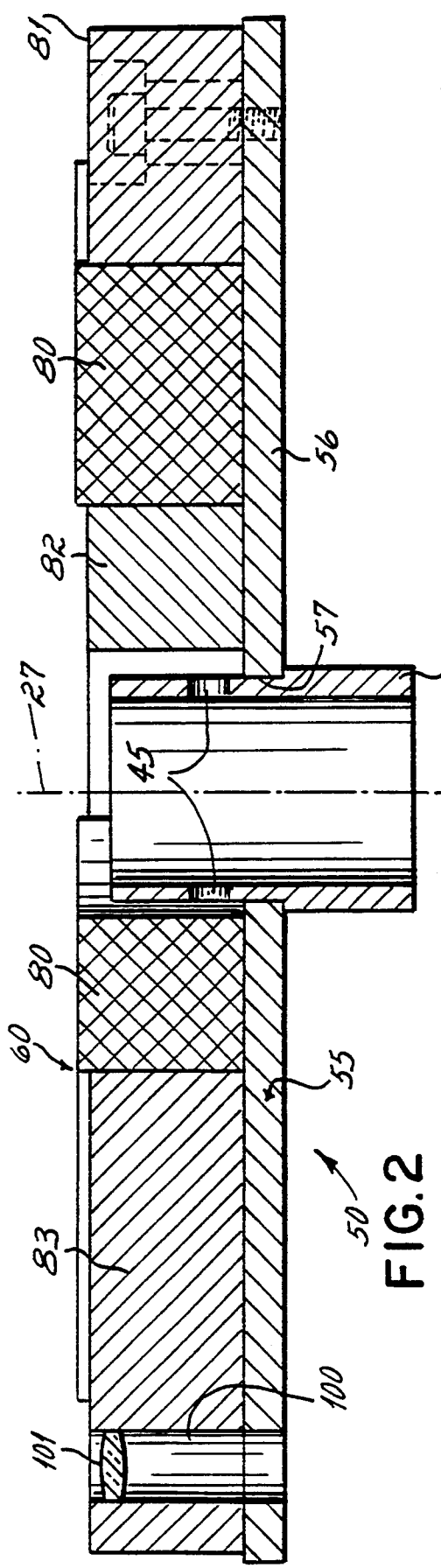
FIG. 2
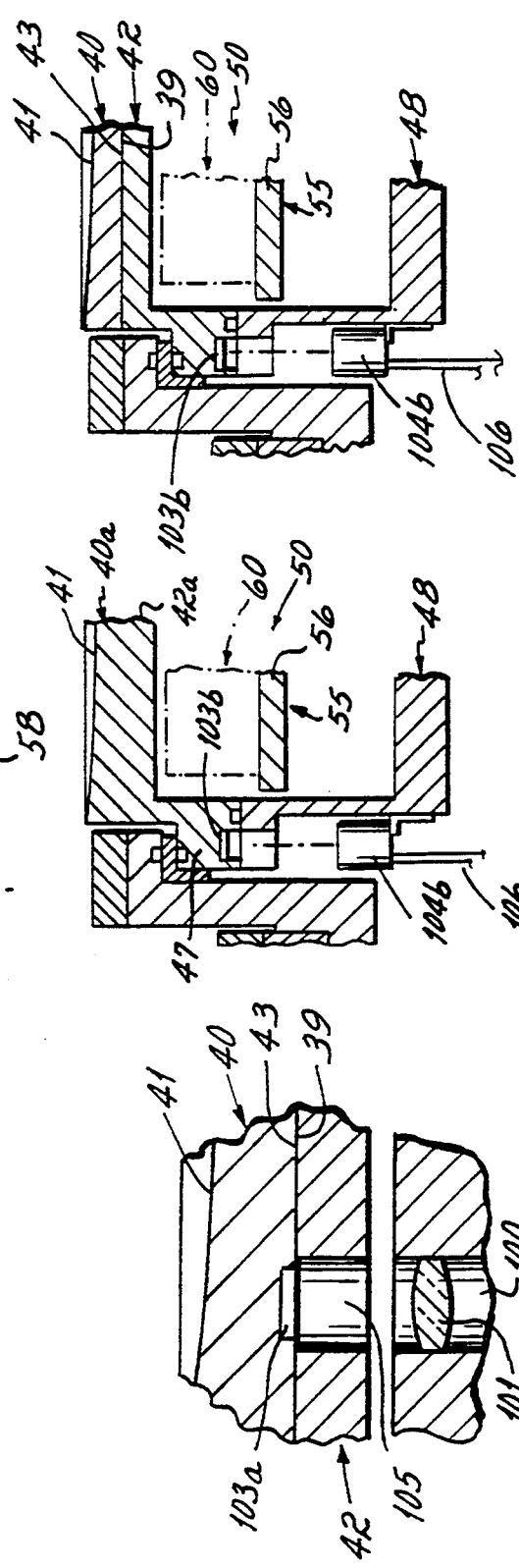
FIG. 4
FIG. 4A
FIG. 3

SPUTTERING TARGET WITH MACHINE READABLE INDICIA

This is a continuation-in-part of U.S. patent application Ser. No. 07/791,415, filed Nov. 13, 1991, now U.S. Pat. No. 5,284,561.

FIELD OF INVENTION

The present invention relates to sputter coating and more particularly to the management and use of information, in a sputter coating system, relating to the identity, characteristics and history of a sputtering target.

BACKGROUND OF THE INVENTION

Sputter coating is a process carried out in a vacuum chamber which is filled with a generally chemically inert gas in which a substrate is coated with a material from a target of sputtering material subjected to a negative electrical potential with respect to the chamber wall or other anode. The potential gradient adjacent the target surface causes electrons to be emitted from the target which, on their way to the chamber anode which is usually formed in part by the grounded chamber wall, strike and ionize some the inert gas. The positive ions formed are then attracted to the negative target which they strike, transferring momentum to the target material, and ejecting particles of the material from the target surface. The substrate to be coated, which is positioned in the chamber usually with its surface facing the target, receives some of the ejected particles which adhere to and coat the substrate surface.

Magnetron sputtering is a sputter coating process in which a magnetic field is formed over the target surface, usually including magnetic field lines parallel to the target surface, and, in many applications, in the form of a closed magnetic tunnel. The magnetic field causes the electrons emitted to move in curved spiral paths which trap them in regions proximate the target surface enclosed by the field, thereby increasing the rate of electron collisions with gas atoms, which in turn increase the ionization of the gas and the efficiency of the sputtering process.

In magnetron sputter coating processes, the sputtering of materials from the sputtering target occurs most rapidly into regions of the target where the plasma trapped by the magnetic field is the most dense. This causes the proportionate consumption or erosion of the sputtering material from the target surface. The erosion of sputtering material from other portions of the sputtering target surface generally occurs at a rate which varies in proportion to the strength and/or duration of the plasma over that portion of the target surface. Such erosion of the target at different rates across the target surface is sometimes desirable to achieve, for example, uniform coating of the substrate, as for example is described in the commonly assigned U.S. Patent No. 4,957,605, hereby expressly incorporated herein by reference.

The shape of a sputtering target as well as its composition determine the operating parameters of the sputtering machine, such as the sputtering power levels, the characteristics of the magnetic fields over the target, the gas composition and pressure within the sputtering chamber, the sputtering process time, and other factors, to which the machine must be set for operation. The shape of the sputtering target varies with the use of the target as the target erodes. The history of the use of the target and of the parameter settings over the course of the history of the target affect the characteristics of the target, including particularly its shape, at any point in the life of the target. Thus, parameter settings for optimal use of the target at any point in time will vary with the history of the use of the particular target. In addition, variations from target to target, such as variations in composition, texture or crystal structure, may require different adjustments in operating parameters of the machine for optimal performance of the sputter coating process. Such adjustments will be experienced as the target is used. Furthermore, the identity of the particular target and information regarding its composition and history of use will, in some cases, be important in evaluating the coated products produced with the sputtering target at any point in its life. This is particularly important when targets are replaced and when targets which have been previously used are installed in a sputtering machine. The use of information regarding the parameters associated with the sputtering process, are discussed in the commonly assigned and copending U.S. patent application Ser. No. 07/570,943, filed Aug. 22, 1990, now U.S. Pat. No. 5,126,028 entitled "Sputter Coating Process Control Method and Apparatus", hereby expressly incorporated herein by reference.

The use of information regarding the identity, characteristics and history of the sputtering target, and the correlation of that information with the products produced by the target has, in the prior art, been a manual process. Similarly, proper settings of the operating parameters of the machine have required manual decision making by the machine operator. Accordingly, the prior art has provide inadequate utilization of information regarding the target, and has provided inefficiency and a risk of error.

Accordingly, there is a need to provide a method and apparatus for effectively maintaining and utilizing information regarding the sputtering target in a sputter coating process.

SUMMARY OF THE INVENTION

It is an objective of the present invention to provide a sputtering coating method and apparatus in which information relating to the specific target present at any point in time in a processing chamber of sputter coating machine is immediately and reliably available. It is a more particular objective of the present invention to make available information relating to the identity, characteristics or history of a sputtering target which is installed in the processing chamber of a sputter coating machine.

According to the principles of the present invention, there is provided a sputtering target assembly having machine readable indicia recorded on a medium carried by an expendable target or portion of the target assembly which is removable with the target. A sputter coating apparatus has a sputtering chamber, in which the target is supported, having a sensor or reader for reading information from the medium.

In the preferred embodiment of the invention, the indicia is coded with unique target identifying information, such as a serial number, which identifies the target and may be correlated with information stored in a memory of the apparatus relating to the characteristics of the target, its composition and/or its history of use. In the alternative, the information coded on the medium may include information of the composition or other characteristics of the target, and may also include the history of the use of the target.

In its alternative embodiments, the medium may be a read only memory which is suitable for recording the target identifying information or the unchanging characteristics of the target such as the target composition. The medium may also be a read/write memory which is suitable for recording information such as target history, which may be updated after each run by writing devices within the sputtering machine in which the target is being used, or may carry date, time, batch number or other such information. Alternatively, a storage medium may written or coded in machine readable form at a location remote from the sputtering chamber and then affixed to the target, the target backing plate, or other structure to which the target is bonded or otherwise secured, when the target is removed from the apparatus.

Where the sputtering material of the target is alone removable for replacement, it is preferable that the medium be carried upon the sputtering material of the target so that it cannot be separable therefrom and is destroyed when the remaining material of the target is recycled at the end of the target life. On the other hand, where the target material is formed and bonded to a nest or backing plate which is removable with the target for replacement, the medium may be carried by the backing plate. In such a case, the medium should be such as to be destructible in the process by which the target material is removed from or bonded to the backing plate so that new information can be coded onto the assembly which corresponds to the new target material.

Further according to principles of the present invention, the sputtering process is preferable carried out by providing a target with coded indicia recorded thereon, in a read-only medium, which uniquely identifies the target and which, in addition, carries information of certain unchangeable data such as the composition of the target or the target design or type. A read head in the apparatus is fixed in the sputtering chamber to read the information from the indicia. The head is connected to circuitry for storing the information in a memory in the machine. A read/write medium on the target contains further information regarding the history of the use of the target, and initially is set to indicate that the target is new. A read/write head in the apparatus is positioned to read information from the read/write medium and to rewrite the information in updated form to indicate the usage put on the target while in the apparatus. Thus, if the target is removed and later reinstalled in the same or another apparatus equipped with features for reading the recorded information, an accurate up-to-date record of the history of the use of the target, and thus information to determine the condition of the target, is available to the sputtering machine. The apparatus preferably includes a microprocessor capable of using the information for analysis of the process or control of the apparatus.

According to the preferred embodiment of the invention, the indicia carrying medium is situated on the back of the target or backing plate to which the target is bonded to be read from or written to from behind the target holder outside of the environment of the sputtering chamber.

These and other objectives and advantages of the present invention will be more readily apparent from the following detailed description of the drawings in which:

BRIEF DESCRIPTION OF THE DRAWINGS

FIG. 2 is a cross-sectional view of the target assembly of the apparatus of FIG. 1.

FIG. 2 is an enlarged view of an alternative embodiment in the area of the encircled portion 3 of FIG. 1.

FIG. 4 is a fragmentary view of a portion of FIG. 1 illustrating another alternative embodiment.

FIG. 4A is a fragmentary view of a portion of FIG. 1 illustrating an alternative embodiment wherein a target backing portion is formed integrally of the target.

DETAILED DESCRIPTION OF DRAWINGS

Sputtering machines of the type to which the present invention relates are described in the following commonly assigned U.S. patents and copending patent applications which are hereby expressly incorporated in their entirety into this application by reference:

U.S. Pat. Nos. 4,909,695 and 4,915,564 entitled "Method and Apparatus for Handling and Processing Wafer-Like Materials";

U.S. patent application Ser. No. 07/339,308, filed Apr. 17, 1989, now U.S. Patent No. 4,957,605, entitled "Method and Apparatus for Sputter Coating Stepped Wafers"; and U.S. patent application Ser. No. 07/606,701, filed Oct. 31, 1990.

The preferred embodiment of the present invention is set forth herein as the sputtering target and cathode assembly of U.S. patent application Ser. No. 07/606,701, abandoned incorporated by reference above, as illustrated in most pertinent part in FIGS. 1 and 2.

Figure 1:
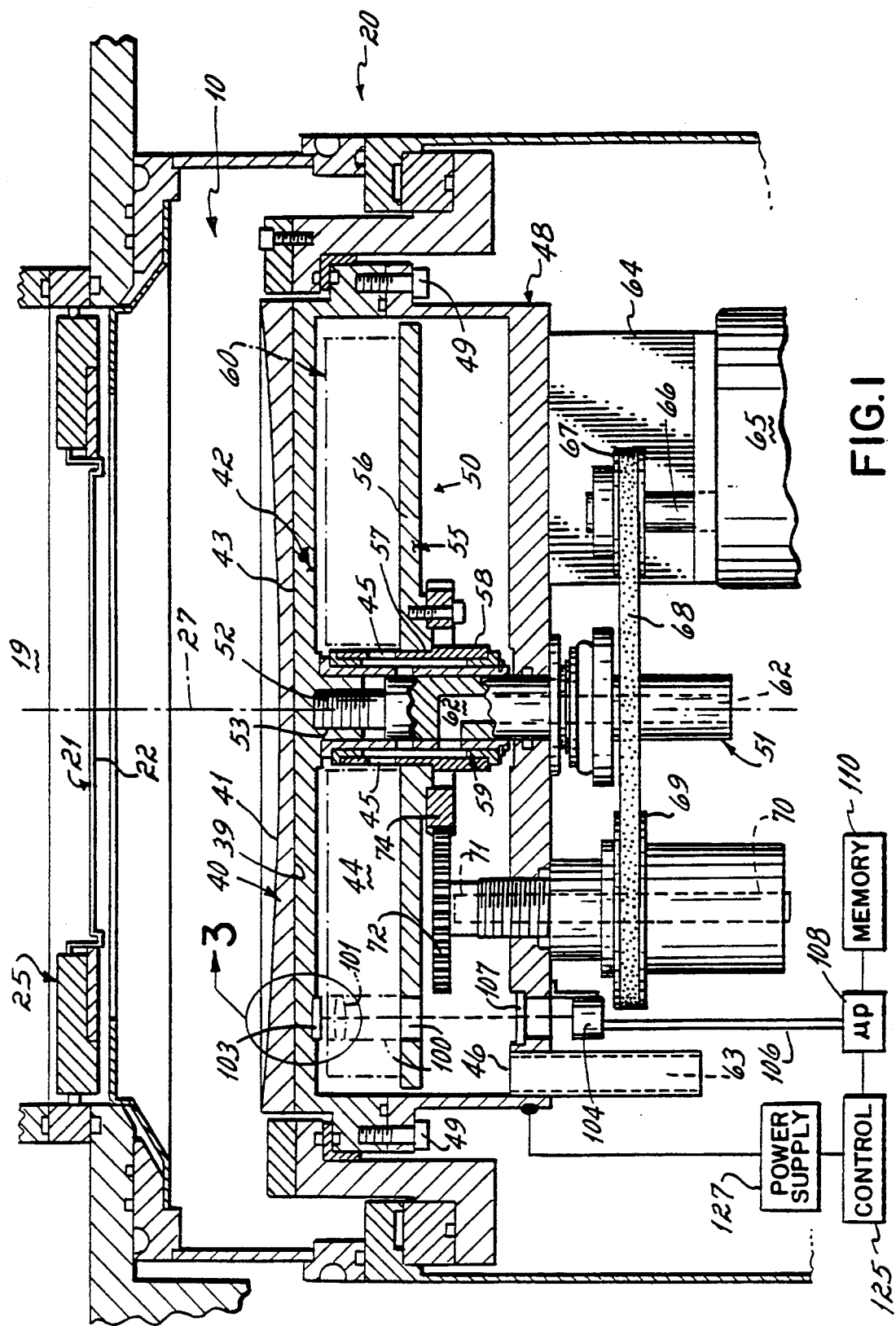
FIG. 1 is a cross-sectional view through of one preferred embodiment of a sputter coating apparatus embodying principles of the present invention.

Referring to FIG. 1, shown in crosssection is a sputter coating processing chamber 10 of a sputter coating apparatus according to principles of the present invention. The chamber 10 is a portion of the sputter processing apparatus disclosed in U.S. Pat. No. 4,909,695.

A backplane space 19 is enclosed within the processing chamber 10. Within the processing chamber 10 between the backplane space 19 and the cathode assembly module 20 is a substrate or workpiece 21 in the form of a flat silicon wafer or disk which has the surface 22 upon which a coating is to be deposited in a sputter coating process to be performed within the processing chamber 10. The wafer 21 is supported in a wafer holder 25. Preferably, the wafer 21 is supported in a plane perpendicular to, and concentric with, a central axis 27 of the processing chamber 10.

The cathode assembly module 20 carries the sputtering target 40, which may be, for example, a circular target having a continuous smooth concave sputtering surface 41 and a back surface 39. The cathode assembly module 20 supports the target 40 with its axis in alignment with the axis 27 of the chamber 10 and with its sputtering surface 41 facing the surface 22 of the wafer 21 to be coated.

The target 40 is supported in a target nest, holder or backing plate 42 having a front surface 43 conforming to surface 39 and concentric with axis 27. The back surface 39 of the target 40 is preferably soldered or otherwise bonded to the front surface 43 of the backing plate 42, in intimate thermal contact therewith. The target back surface 39 is a cooling surface which, when the target 40 is mounted in holder 42, conforms to and lies in close cooling contact with the surface 43 of the holder 42. Behind the backing plate 42, opposite the cooling surface 43 thereof, is a space 44 for the circulation of cooling liquid, which is generally water, to remove heat generated in the target 40 during sputtering by cooling the heat conductive target holder 42. The cooling fluid is circulated into and out of the space 44 from an inlet port 45 to an outlet port 46 in a magnet assembly 50, as described below. The space 44 is enclosed behind the backing plate 42 by a housing structure 48 onto which the backing plate 42 is rigidly supported, and to which it is secured by bolts 49.

Preferred shapes of the surfaces of the target 40 are those capable of being formed by turning a block of sputtering material on a lathe. The target holder 42 is made of a heat conductive and electrically conductive material, preferably hard tempered OFHC copper or Alloy 110.

In the illustrated embodiment of the invention, the magnet assembly 50 includes a shaft 51 having a threaded end 52 by which the shaft 51 is rigidly mounted in a threaded bore 53 at the center of the back surface of the backing plate 42. The assembly 50 also includes a rotatable magnet carrier assembly 55 which includes a circular disk 56 of non-magnetic stainless steel or other such material having a central hole 57 therein at which the disk 56 is rigidly mounted to a sleeve assembly 58 rotatably mounted through a bearing assembly 59 through the housing 48 and to the backing plate 42 to rotate about the shaft 51 on the axis 27. The rotatable magnet assembly further includes a magnet structure 60 rigidly mounted on the disk 56 to rotate therewith. The magnet 60 surrounds the axis 27 and lies beneath or behind the backing plate 42, opposite the front surface 43 thereof, and close enough thereto to generate a closed magnetic field above the sputtering surface 41 of the target 40 mounted on the surface 43 of the backing plate 42.

The shaft 51 has a cooling fluid inlet duct 62 extending therethrough which communicates with the inlet port 45 to the interior cooling chamber 44 between the backing plate 42 and the housing 48. The housing 48 has mounted near the edge thereof a cooling fluid outlet duct 63 which communicates with the fluid outlet port 46 in the cooling space 44.

Mounted to the back of the housing 48 is a bracket 64 to which is mounted a magnet rotary drive motor 65. The motor 65 has an output shaft 66 with a cogged drive wheel 67 mounted at the end thereof for driving a cogged drive belt 68. The belt 68 extends around a cogged drive wheel 69 attached to a drive shaft 70 which is rotatably mounted on the housing 48 extending therethrough and having a free end 71 to which is mounted a drive gear 72. The drive gear 72 is positioned within the space 44 where it engages a mating gear 74 attached to the disk 56 of the rotatable magnet assembly 50. Accordingly, the motor 65, when energized, rotates the magnet assembly 50 to rotate the magnet 60 behind the target backing plate 42 to rotate the magnetic field over the sputtering surface 41 of the target 40.

The details of the construction of the magnet structure 60 and its arrangement on the magnet assembly 50 can be better understood by reference to FIG. 2. The magnet structure 60 is a non-concentric loop magnet 80, which is held in place in a particular predetermined shape surrounding axis 27 by clamping blocks 81-83.

Referring to FIGS. 1 and 2, the magnet carrier assembly 55 has extending therethrough a hole 100, which may be an filled with an optically transparent lens 101, in the clamping block 83 and the plate 56. Secured to, and embedded so as to be flush with, the back of the target backing plate 42 so as to align with the hole 100, when in one angular position, is a read-only medium carrying indicia, such as an optically readable bar-code 103. Adjacent the housing 48, opposite the barcode 103, is a conventional bar-code reading head 104, which may include a laser light source and receiver. The lens 101 may be such as to scan the bar code to transmit the laser light to and from the bar-code 103 so as to be read by the sensor of the reader 104 outside of a window 107 in the housing 48.

In the alternative embodiment of FIG. 3, the medium carrying the bar-code 103a is carried directly by the target 40 on the back surface 39 thereof. In this embodiment, a hole 105 is provided in the backing plate 42 to expose the bar code 103a to be viewed from behind the backing plate 42.

A further embodiment is shown in FIG. 4, wherein the bar code or other storage device 103b is mounted to an external flange of the backing plate 42 to be read by the reader 104b mounted external of the housing 48.

An alternative embodiment of the target and backing plate structure described above is illustrated in FIG. 4A, in which an expendable target 40a is made to include, in an integral piece of target material, the combined structure and function of the elements of both the target 40 and backing plate 42 of the embodiments of FIGS. 1, 3 and 4, so that the target 40a takes the place of the target 40 and backing plate or support 42 of FIGS. 1, 3 and 4.

In FIG. 4A, which is similar to the embodiment of FIG. 4, the storage device 103b is mounted to an external flange 47 of the backing portion 42a of the target 40a, to be read by the reader 104b mounted external of the housing 48. Such backing portion 42a is formed integrally of the sputtering material of the target 40a. Such integral target and backing assemblies are suitable where the target material is aluminum, titanium or other such material that can be fabricated easily and that will provide the structural and thermal properties of a backing plate 42 of the two piece embodiments.

As with the embodiments described above, the recorded indicia is remote from the sputtering surface 41 of the target, and thus is not eroded or destroyed by the sputtering process. The indicia are nonetheless destroyed whenever the remaining target material is recycled after the useful portion of the target is expended.

The sensor of the reader 104 (or 104a) has signal lines 106 connected to terminals of a microprocessor 108 which is, in turn, provided with a bus connected to a memory 110. The information on the bar code is, in one embodiment, a serial number of the target 40. In the memory 110 is stored, in this embodiment, information regarding the composition of the target and data regarding the history of the target 40 and of other targets correlated with the respective targets by serial number. Controls 125 of the apparatus may be connected to an output of the microprocessor 108 which, through a control program, may respond to the composition and history data stored in the memory 110. In this way, the control 125 may, with outputs connected to a target power supply 127, for example, control parameters of the process such as the power applied to the target during the sputtering operation, all as more particularly described in the above incorporated patent application Ser. No. 07/570,943, now U.S. Pat. No. 5,126,028.

In other embodiments, the storage device 103, 103a or 103b may contain information such as the target composition or target power limits.

In further alternative embodiments, a non-volatile read/write medium is provided in, or in addition to, the storage device 103, 103a or 103b. In such embodiments, a read/write device is provided in, or in addition to, the reader 104 or 104b and connected to input/output ports of the microprocessor 108 through lines 106. With the read/right medium and read/write head, data such as the history of the usage of the target in the apparatus, as, for example, power applied to the target, total energy consumed by the target, processing time, the date and time of the processing operation, the batch numbers or other wafer identification information, may be stored by the head 114 on the medium 113.

The indicia recording media 103, 103a, or 103b affixed to the target backing plate target is in a form that will be destroyed by the bonding process by which a new target is attached to the backing plate 42. For example, a bar code may be written with ink that fades at a temperature required for bonding a target to the backing plate by soldering, should that be the bonding method employed. Alternatively, the medium may be made of a material that will melt at the bonding temperature, or may be affixed to a structure that will be mechanically destroyed in bonding or debonding of a target.

Figure 5:
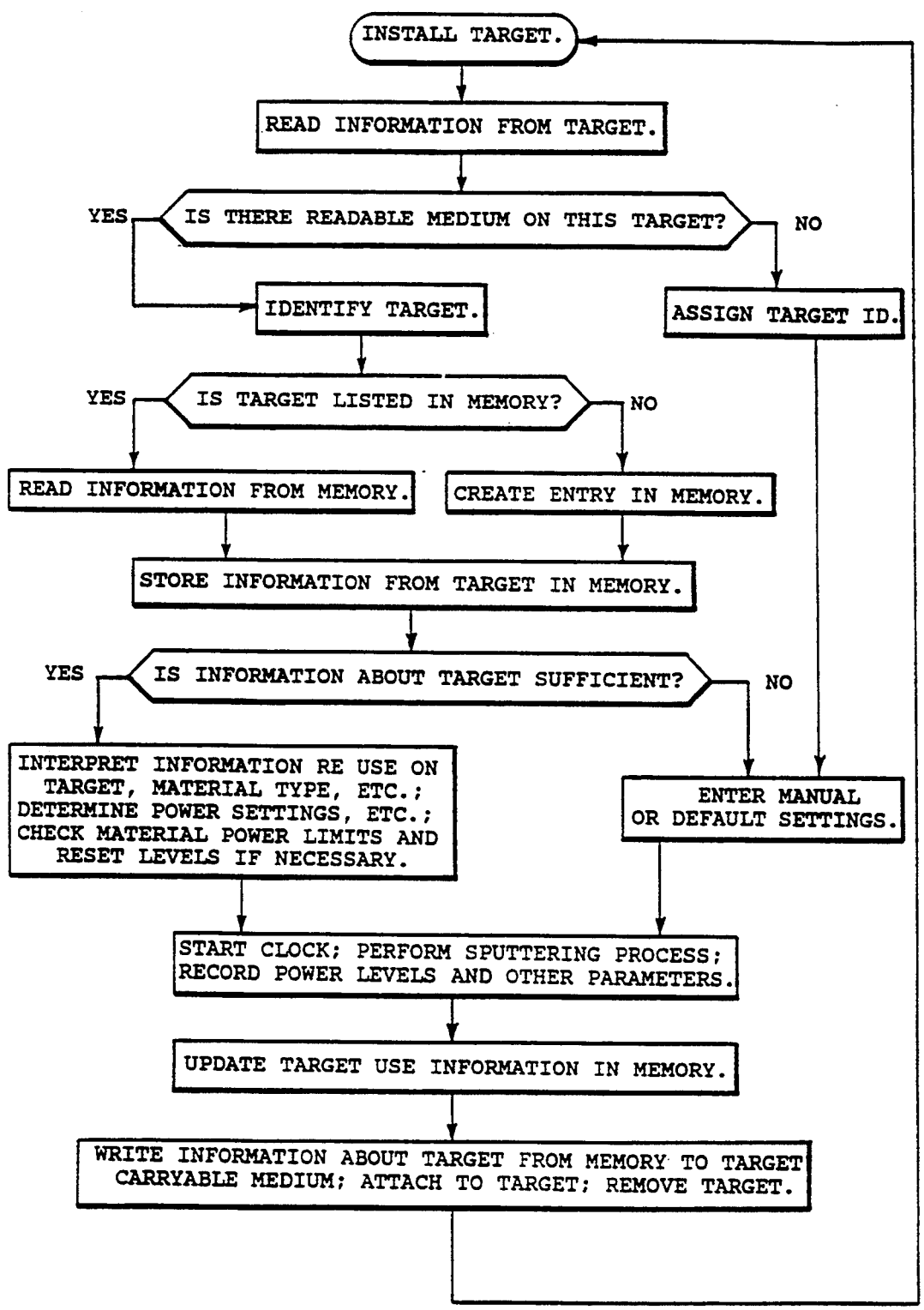
FIG. 5 is a flow chart of one preferred embodiment of the operation of the apparatus of FIG. 1.

The operation of the invention will be best understood by reference to FIG. 5, which is a flow chart of the operation of the microprocessor 108 and control 125 according to one embodiment of the invention. Upon or following the installation of a target, the indicia affixed to the target or backing plate is caused to be read. Then the information, if any, that is read is tested to determine whether there is in fact machine readable indicia carried by the target. If there is none, some unique identification is assigned to the target so that information regarding the target may be recorded. Thus, it will not be necessary that the target be provided with a machine readable code in order for the target to be used in the sputtering apparatus. Such a target will be used with the operating parameters of the machine set in any manner used prior to the provision of the present invention. Such parameters may be manually entered or set to default settings by the machine control.

If machine readable indicia recognized by the microprocessor program is read from the target, then the target identification code is interpreted by the program and any other information recorded on and read from the target is interpreted. Such other information may be that of the type of material of the target, of special parameter settings, or of the history of the past use of the target. Such past use may be that of the total sputtering energy consumed by the target over its life to date, which can be used as an indication of the state of erosion of the target and thus its surface contour.

The interpreted identity of the target is then compared with information stored in the memory 110 to determine whether the target has been previously used in the apparatus, or to determine whether information regarding the target being installed has been loaded into the memory. If the identity of the target in the memory is not found, an entry of the target identification is made in the memory and the other information, if any, read from the target is stored corresponding storage locations in the memory. In certain embodiments, it may be preferable to read only a target identification code, and perhaps also a target material type, from the target and resort to information pre-stored in the memory along with the target identity code.

Next, the information read from the target and retrieved from the memory relating to the target is checked to determine whether there is sufficient information by which the machine operating parameters can be set so that a sputter coating process can be performed with the newly installed target. If sufficient information is not present, then provision is made for the manual entry of additional information by an operator or for the assignment of program selected or default parameter settings.

If sufficient information is read from the target or retrieved from the memory relating to the target, then the information is interpreted and parameters are set for the operation of the apparatus to perform the sputter coating process. Information of the age of the target and of the target material may be used to set sputtering power levels, for example. The target type and target material may also be used to set maximum power limits.

Once the parameters are set, the process can be initiated. As the process is performed, a clock and calendar may cause the date and time to be recorded in memory, along with the parameter settings by which the process is being performed with the target. Also, information such as the wafer batch numbers and number of substrates being coated may be recorded in memory locations corresponding to the target. Preferably, the time in use and the power levels applied to the target, together with a log of the total energy being applied to the target, are recorded for the target. For each use of the target thereafter, this information is updated for the target in the memory.

Preferably, the stored information is written onto the target medium, or onto a medium which can be affixed to the target. The writing of the information may be done directly in the apparatus with the write head 114 writing onto the writable medium 113. However, in that the environment in the chamber is generally hostile to many desirable writing techniques, a medium may be written with the updating information at a location remote from the sputtering chamber, in machine readable form, such as by the printing of an optically readable barcode, and the medium affixed to the target upon removal from the chamber.

From the description of the invention, to those skilled in the are it will be apparent that the invention may take various forms. Accordingly, the scope of this patent should be limited only by the following claims:

We claim:

1. An target of sputter coating material having a sputter coating surface, the target comprising:

an information storage medium fixed to the sputter coating material to be removable with the target when the target is removed from a sputter coating apparatus, the medium being located thereon on the target remote from the sputter coating surface so as not to be consumed when the target is used in a sputter coating process;

the storage medium having recorded thereon, in machine readable indicia, information relating to a characteristic of the target.

2. The target of claim 1 wherein the information recorded on the medium includes information relating to the identity of the target.

3. The target of claim 1 wherein the information recorded on the medium includes information relating to the history of the target.

4. The target of claim 1 wherein the information recorded on the medium includes information relating to the composition of the target.

5. The target of claim 1 wherein the medium is a read-only medium.

6. The target of claim 1 wherein the medium is a read-write medium.

7. An target of sputter coating material having a sputter coating surface on a side thereof, a heat transfer surface on a side thereof opposite the sputtering surface, a mounting rim formed of the sputter coating material between the sputtering surface and the heat transfer surface for mounting the target to a housing of a sputter coating apparatus, the target comprising:

an information storage medium fixed to the sputter coating material to be removable with the target when the target is removed from the sputter coating apparatus, the medium being located at the rim between the sputter coating surface and the heat transfer surface so as not to be consumed when the target is used in a sputter coating process;

the storage medium having recorded thereon, in machine readable indicia, information relating to a characteristic of the target.

8. The target of claim 7 wherein the information recorded on the medium includes machine readable indicia uniquely coded to identify the target.

9. The target of claim 7 wherein the information recorded on the medium includes machine readable indicia coded with information relating to the history of the target.

10. The target of claim 7 wherein the information recorded on the medium includes machine readable indicia coded with information relating to the composition of the target.

11. The target of claim 7 wherein the medium is a read-only medium.

12. The target of claim 7 wherein the medium is a read-write medium.

* * * * *